United States Patent [19]
Kuroda et al.

[11] Patent Number: 5,508,527
[45] Date of Patent: Apr. 16, 1996

[54] METHOD OF DETECTING POSITIONAL DISPLACEMENT BETWEEN MASK AND WAFER, AND EXPOSURE APPARATUS ADOPTING THE METHOD

[75] Inventors: Ryo Kuroda, Machida; Toshihiko Miyazaki, Hiratsuka; Kunihiro Sakai, Isehara; Hiroyasu Nose, Zama; Kiyoshi Takimoto, Isehara, all of Japan

[73] Assignee: Canon Kabushiki Kaisha, Tokyo, Japan

[21] Appl. No.: 298,316

[22] Filed: Sep. 1, 1994

Related U.S. Application Data

[63] Continuation of Ser. No. 10,300, Jan. 28, 1993, abandoned.

[30] Foreign Application Priority Data

Jan. 31, 1992 [JP] Japan ..................................... 4-040723

[51] Int. Cl.$^6$ ........................................................ G01J 1/00
[52] U.S. Cl. ............................................................. 250/491.1
[58] Field of Search ................................. 250/491.1, 306, 250/307; 379/34, 35, 205, 206, 163

[56] References Cited

U.S. PATENT DOCUMENTS

| | | | |
|---|---|---|---|
| 4,912,408 | 3/1990 | Sawada et al. | 324/207.13 |
| 5,130,554 | 7/1992 | Nose et al. | 250/548 |
| 5,150,392 | 9/1992 | Hohn et al. | 250/491.1 |
| 5,157,251 | 10/1992 | Albrecht et al. | 250/307 |
| 5,168,159 | 12/1992 | Yagi | 250/307 |
| 5,245,863 | 9/1993 | Kajimura et al. | 250/306 |

OTHER PUBLICATIONS

Physical Review Letters, vol. 56, No. 9, "Atomic Force Microscope" by Binnig, et al., pp. 930 to 933, Mar. 3, 1986.

Applied Physics Letters, vol. 31, No. 7, "A New Interferometric Alignment Technique", by Flanders, et al., pp. 426–428, Oct. 1, 1977.

*Primary Examiner*—Jack I. Berman
*Assistant Examiner*—Kiet T. Nguyen
*Attorney, Agent, or Firm*—Fitzpatrick, Cella, Harper & Scinto

[57] ABSTRACT

A method and apparatus for detecting the relative positional displacement between a mask and a wafer. The mask is provided with a cantilever. The position mark is provided on the wafer so as to face the cantilever. A relative positional displacement between the mask and the wafer is detected from a deformation amount of the cantilever based on a force acting between the position mark and the cantilever upon relative movement of the position mark and the cantilever.

11 Claims, 10 Drawing Sheets

METHOD OF DETECTING POSITIONAL DISPLACEMENT BETWEEN MASK AND WAFER, AND EXPOSURE APPARATUS ADOPTING THE METHOD

This application is a continuation of application Ser. No. 08/010,300 filed Jan. 28, 1993, now abandoned.

BACKGROUND OF THE INVENTION

1. Field of the Invention

The present invention relates to an exposure apparatus such as an X-ray stepper for, e.g., semiconductors requiring manufacturing rules on the order of micrometers or less, and the method of detecting a relative positional displacement between a mask and a wafer in the apparatus.

2. Related Background Art

Figure 1:
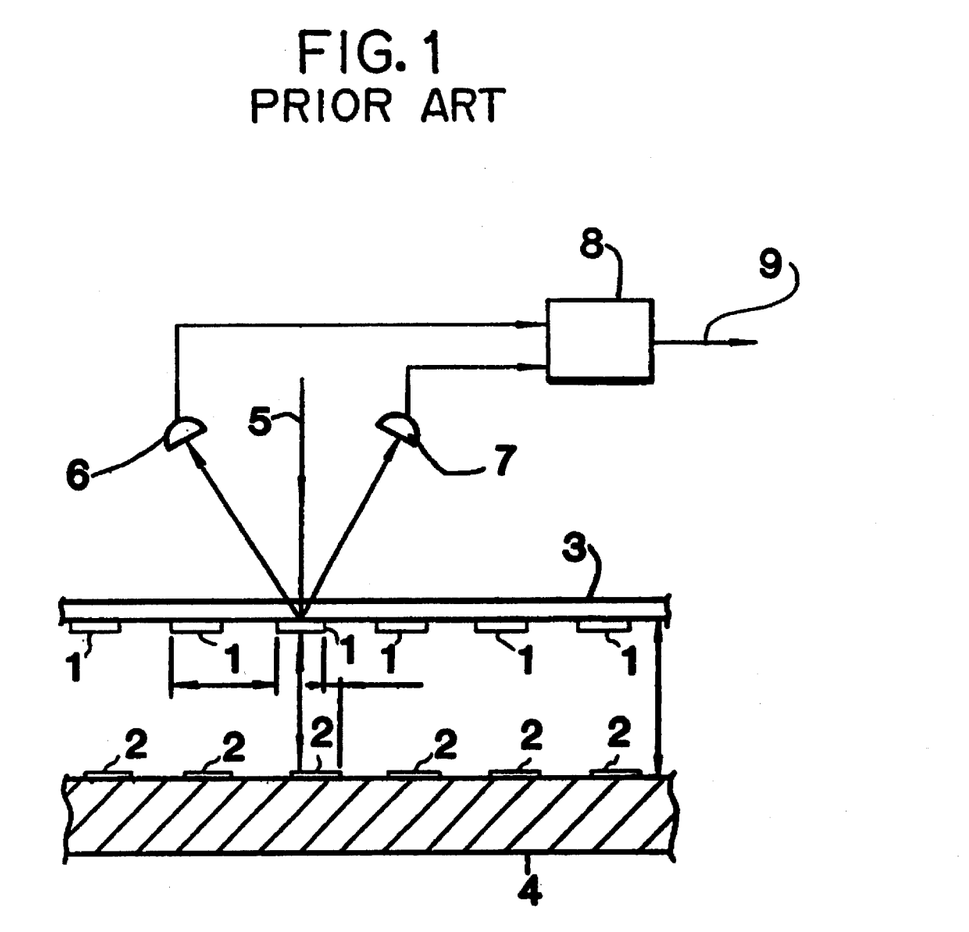
FIG. 1 is a sectional view showing a conventional mask wafer alignment apparatus.

The degrees of integration of semiconductor elements such as LSIs keep on increasing, and g- and i-line steppers are commercially available at present. Furthermore, exposure apparatuses, X-ray steppers, and the like using an excimer laser are beginning to make the transition from the study phase to the practical application phase. Such an exposure apparatus can achieve a line width resolution of 0.25 µm to 0.1 µm. However, the relative position alignment precision between a mask and a wafer required for achieving the above-mentioned resolution is at least 1/10 the resolution, i.e., 30 to 10 nm. As the high-precision position alignment method, a double diffraction grating method has been proposed [Flanders et. al, "Appl. Phys. Lett. 31, 426 (1977)"]. FIG. 1 shows the principle of this method. In this method, diffraction gratings 1 and 2 are respectively provided to a mask 3 and a wafer 4, laser beams are projected on these gratings, and the interference light intensities of a plurality of diffracted light components from these gratings are detected, by detectors 6 and 7 which transmits a signal to a calculator 8 which generates an alignment signal thereby detecting the relative positional displacement between the mask 3 and the wafer 4, and aligning them according to their relative position.

However, in the above-mentioned conventional double diffraction grating method, the alignment precision is determined by the formation precision of the diffraction gratings on the mask and the wafer. In the current state of the art, the pitch of the diffraction gratings is accurate up to 1 µm, and the formation precision of the gratings is accurate up to 0.1 µm. Even if the averaging effect corresponding in number to the grating marks contributing to light diffraction is taken into consideration, the limit of the alignment precision is 10 nm. Therefore, in an exposure apparatus used in microprocesses of semiconductors whose degree of integration is expected to further increase in the future, a method of aligning the relative position between a mask and a wafer with a precision on the order of 1 nm is demanded.

Meanwhile, an interatomic force microscope (to be abbreviated to as an "AFM" hereinafter) has been [Binnig et. al, Phys. Rev. Lett. 56, 930 (1986)], so that three-dimensional pattern information (unevenness information) on a surface can be obtained on the atomic molecular order. In the AFM, a force acting between a sample and a probe is detected from a flexure amount of a cantilever, caused by the force, which comprises an elastic member for supporting the probe and which is set near the sample surface within a distance of 1 nm or less thereto. More specifically, in the AFM, the sample surface is scanned while controlling the distance between the sample and probe so as to keep the detected force constant, whereby the three-dimensional pattern on the surface is observed with a resolution on the order of 1 nm or less. Since the sample need not have a conductivity, the AFM can observe an insulative sample, in particular, a semiconductor resist surface, a biological high polymer, and the like on the atomic molecular order.

SUMMARY OF THE INVENTION

The present invention has been made in consideration of the conventional problems, and has as its object to provide a method wherein an elastic member for supporting a probe is provided on a wafer or a mask, the probe is set to oppose a mark formed on the wafer or the mask, and, for example, interval control in the normal direction between the mask and wafer is performed while detecting the deformation of the elastic member caused by a force acting between the probe and the mark, or the mask and the wafer are relatively scanned in the horizontal direction, and a relative positional displacement between the probe and the mark is detected on the basis of the deformation of the elastic member caused by the force, thereby aligning the relative position between the mask and the wafer on the order of 1 nm. In particular, when this method is used, a relative positional displacement between the wafer coated with an insulative resist and a mask can be detected since no electricity is used.

DETAILED DESCRIPTION OF THE PREFERRED EMBODIMENTS

The present invention will be described hereinafter with reference to its embodiments.

Figure 2:
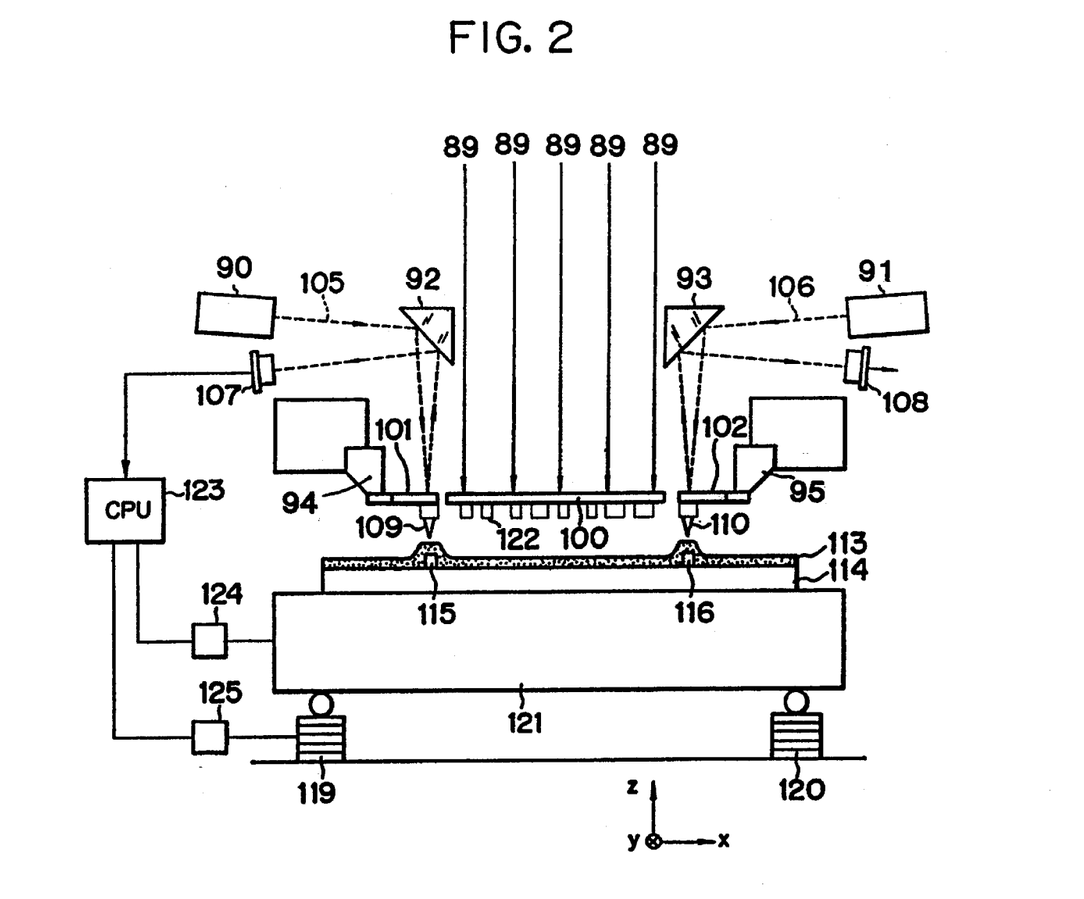
FIG. 2 is a sectional view showing a mask wafer alignment apparatus according to an embodiment of the present invention.
Figure 3:
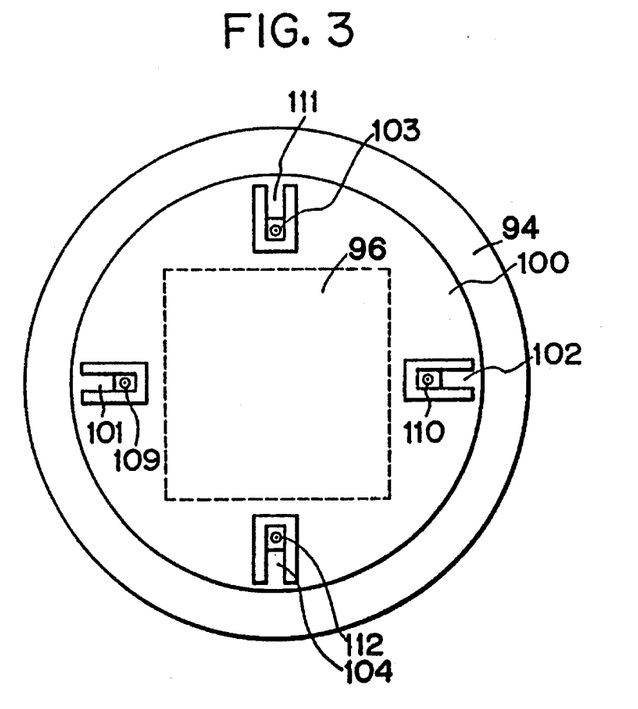
FIG. 3 is a plan view showing an arrangement of cantilevers arranged on a mask shown in FIG. 2, and each constituted by an elastic member.
Figure 4:
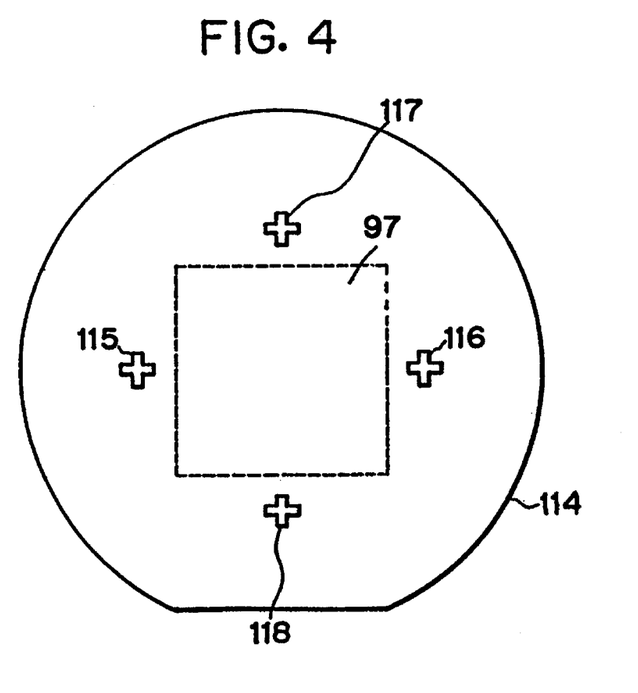
FIG. 4 is a plan view showing an arrangement of positioning marks on a wafer shown in FIG. 2.

FIGS. 2 to 4 show a mask-wafer alignment apparatus (an X-ray exposure apparatus) according to an embodiment of the present invention. FIG. 2 is a sectional view, FIG. 3 is a plan view of cantilevers arranged on a mask, and each is constituted by an elastic member, and FIG. 4 is a plan view of positioning marks on a wafer. In FIG. 2, X-rays 89 are incident on the mask 100 to expose the mask to radiation and laser beams a: 105, b: 106, c, and d (the beams c and d are not shown) are projected from laser 90 and 91 arranged above a mask 100 having a mask pattern 96 and reflected by mirrors 92 and 93 onto the rear surfaces of the distal ends of cantilevers a: 101, b: 102, c: 103, and d: 104 (the cantilevers 103 and 104 are shown in FIG. 3) arranged on the mask 100 and each is constituted by an elastic member, and the beam spot positions of the beams reflected by the rear surfaces of the cantilevers are detected by position detectors a: 107, b: 108, c, and d (the detectors c and d are not shown). Mask holders 94 and 95 are provided for cantilevers 101 and 102, respectively. Probes a: 109, b: 110, c: 111, and d: 112 (the probes 111 and 112 are shown in FIG. 3) are respectively provided for the surfaces of the distal ends of the cantilevers a: 101, b: 102, c: 103, and d: 104, and respectively oppose positioning marks a: 115, b: 116, c: 117, and d: 118 on a wafer 114 around an exposure area 97 via a resist film 113. The intervals between the probes a: 109, b: 110, c: 111, and d: 112 and the positions of the resist film 113 on the positioning marks a: 115, b: 116, c: 117, and d: 118 are set to be 1 nm or less, and a force (van der Waals force) as very weak as $10^{-6}$ to $10^{-8}$ N acts between the tips of the probes a to d and the resist film 113. When the mask 100 and the wafer 114 are relatively displaced in the x-, y- or z-direction, and the magnitude of the force acting between the tips of the probes a to d and the resist film 113 changes, since the tips of the probes a to d move in the z-direction, the flexure amounts of the cantilevers a to d, each constituted by an elastic member, for supporting the probes a to d change, and the beam spot positions of the reflected beams detected by the position detectors a to d change. Upon detection of this positional displacement ($\Delta Z$), the flexure amounts of the cantilevers a to d, i.e., the moving amounts ($\Delta z$) of the tips of the probes a to d can be detected. In practice, if the length of a cantilever is represented by l, and the distance between the rear surface of the cantilever and the corresponding position detector is represented by L, the moving amount $\Delta z$ is given by:

$$\Delta z = \frac{l}{L} \Delta Z$$

Based on these moving amounts and the elastic constant of the cantilevers, the magnitudes of the forces acting between the tips of the probes a to d and the resist film 113 can be calculated. Note that the moving amounts and the acting forces are calculated by a CPU 123 on the basis of the outputs from the corresponding position detectors. The same applies to $\Delta x$ and $\Delta y$ (to be described later).

The method of controlling the interval between the mask 100 and the wafer 114 will be explained below. Each of the probes a to d at the distal ends of the cantilevers has a predetermined length (about 10 to 30 µm), and this length determines the interval between the mask 100 and the wafer 114. More specifically, when the wafer is caused to approach the mask from an initial separate state, the driving amounts of four z-driving mechanisms a: 119, b: 120, c, and d (although the mechanisms c and d are not shown in FIG. 2, they are arranged at fourfold symmetric positions with respect to the central axis of the mask-wafer, i.e., in a direction perpendicular to the plane of drawing of FIG. 2) are adjusted by the CPU 123, so that the four probes a to d approach the resist film 113 on the wafer, and forces having the same magnitude of $10^{-6}$ N or less act between the probes a to d and the resist film. In this case, since a plane is determined by three points, the four z-driving mechanisms are not independently driven. More specifically, the position of the wafer surface is calculated by the CPU 123, so that a variation (standard deviation) of the forces acting between the four probes a to d and the resist film is minimized, and the four z-driving mechanisms are driven on the basis of the calculated value through a z-driving circuit.

Figure 9:
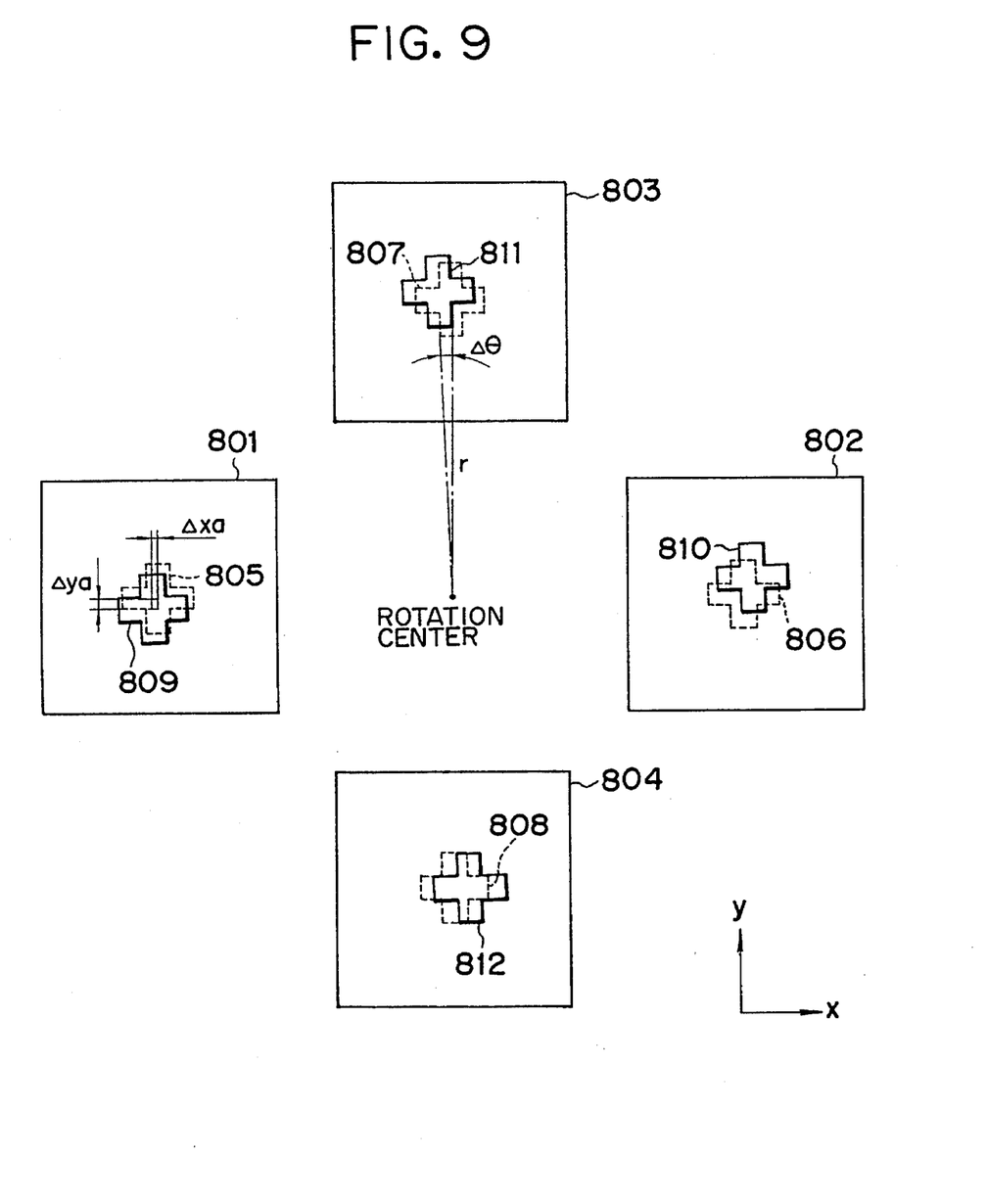
FIG. 9 is an explanatory view for explaining an alignment method based on two-dimensional scanning in the horizontal direction of the mask and the wafer.

The method of aligning the mask 100 and the wafer 114 in the x- and y-directions will be described below. The wafer 114 is placed on an xyθ stage 121, and is two-dimensionally scanned in the x- and y-directions with respect to the mask. At this time, the probes a to d scan the positioning marks a to d via the resist film. Thus, when the moving amounts (i.e., the flexure amounts of the cantilevers or the deviations of beam spot positions on the position detectors) of the probes a to d in the z-direction are plotted for two-dimensional scanning points, the positions of the positioning marks within the two-dimensional scanning ranges of the probes a to d can be detected. Since the van der Waals forces are detected, even when a resist (e.g., an insulative resist) is coated, the marks can be detected. FIG. 9 shows an example of mark position detection. FIG. 9 illustrates the positional displacements of the positioning marks a to d before and after a given process. The positional displacements of the marks a to d from a state before the process are respectively represented by $(\Delta x_a, \Delta y_a)$, $(\Delta x_b, \Delta y_b)$, $(\Delta X_c, \Delta y_c)$, and $(\Delta x_d, \Delta y_d)$. The causes for these positional displacements include displacements $\Delta x_1$ and $\Delta y_1$ in the x- and y-directions upon re-setting of the wafer before and after the process, a rotational displacement $\Delta \theta$, and distortions (e.g., thermal expansions, contractions, and the like) $\Delta x_2$ and $\Delta y_2$ during the process, and these causes have the following relationships with the above-mentioned positional displacements.

$$\Delta x_a = \Delta x_1 - \frac{\Delta x_2}{2}$$

$$\Delta y_a = \Delta y_1 - \gamma \Delta \theta$$

$$\Delta x_b = \Delta x_1 + \frac{\Delta x_2}{2}$$

$$\Delta y_b = \Delta y_1 + \gamma \Delta \theta$$

$$\Delta x_c = \Delta x_1 - \gamma \Delta \theta$$

$$\Delta y_c = \Delta y_1 + \frac{\Delta y_2}{2}$$

$$\Delta x_d = \Delta x_1 + \gamma \Delta \theta$$

$$\Delta y_d = \Delta y_1 - \frac{\Delta y_2}{2}$$

where γ is the distance from the rotation center.

Using these equations, the CPU 123 calculates $\Delta x_1$, $\Delta y_1$, $\Delta x_2$, $\Delta y_2$, and $\Delta \theta$, and drives the xyθ stage 121 (FIG. 2) on the basis of the calculated values, thereby correcting the positional displacements before and after the process through an xyθ stage driving circuit 124. For example, when the size of the positioning mark is assumed to be 0.5 µm, the size of the scanning region is assumed to be 2 µm×2 µm, and the x-y (horizontal) resolution upon scanning of the positioning marks by the probes is assumed to be $1/100 \times 1/100$, the alignment precision is 20 nm. In order to further improve the precision, after the positional displacements are corrected by the above-mentioned procedure, the same procedure is repeated using a scanning region of a size $1/10$ that of the above-mentioned region, i.e., a 200 nm ×200 nm region. Thus, the alignment precision can be further improved to the order of 1 nm. Theoretically, the alignment precision can be infinitely improved upon repetition of the above-mentioned procedure. However, in practice, the distortions $\Delta x_2$ and $\Delta y_2$ during the process cannot be perfectly corrected, and they determine the alignment precision. Thus, the correction is made, so that the overall positional displacement is decreased (e.g., the deviations of the displacements in two directions, i.e., the x- and y-directions of each probe are minimized).

Figure 10:
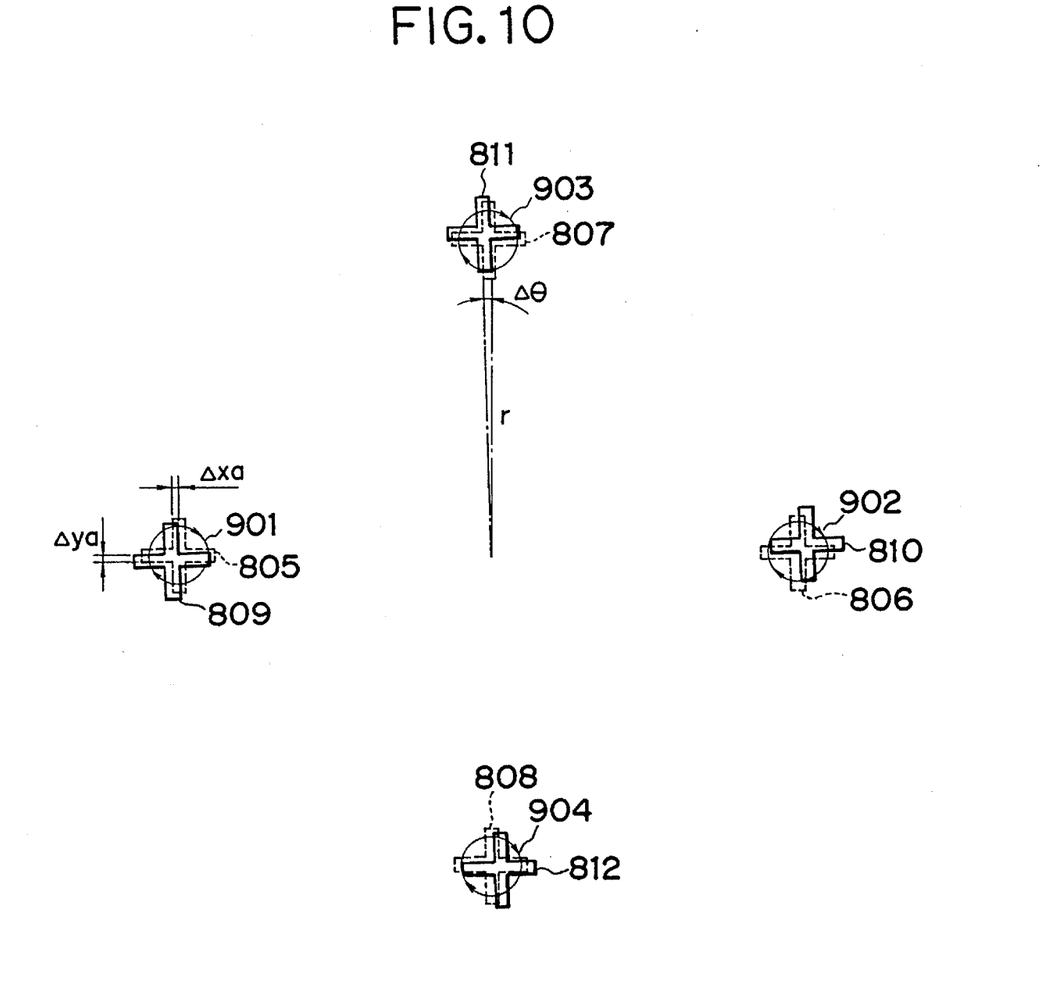
FIG. 10 is an explanatory view for explaining an alignment method based on one-dimensional curvilinear scanning in the horizontal direction of the mask and the wafer.
Figure 11:
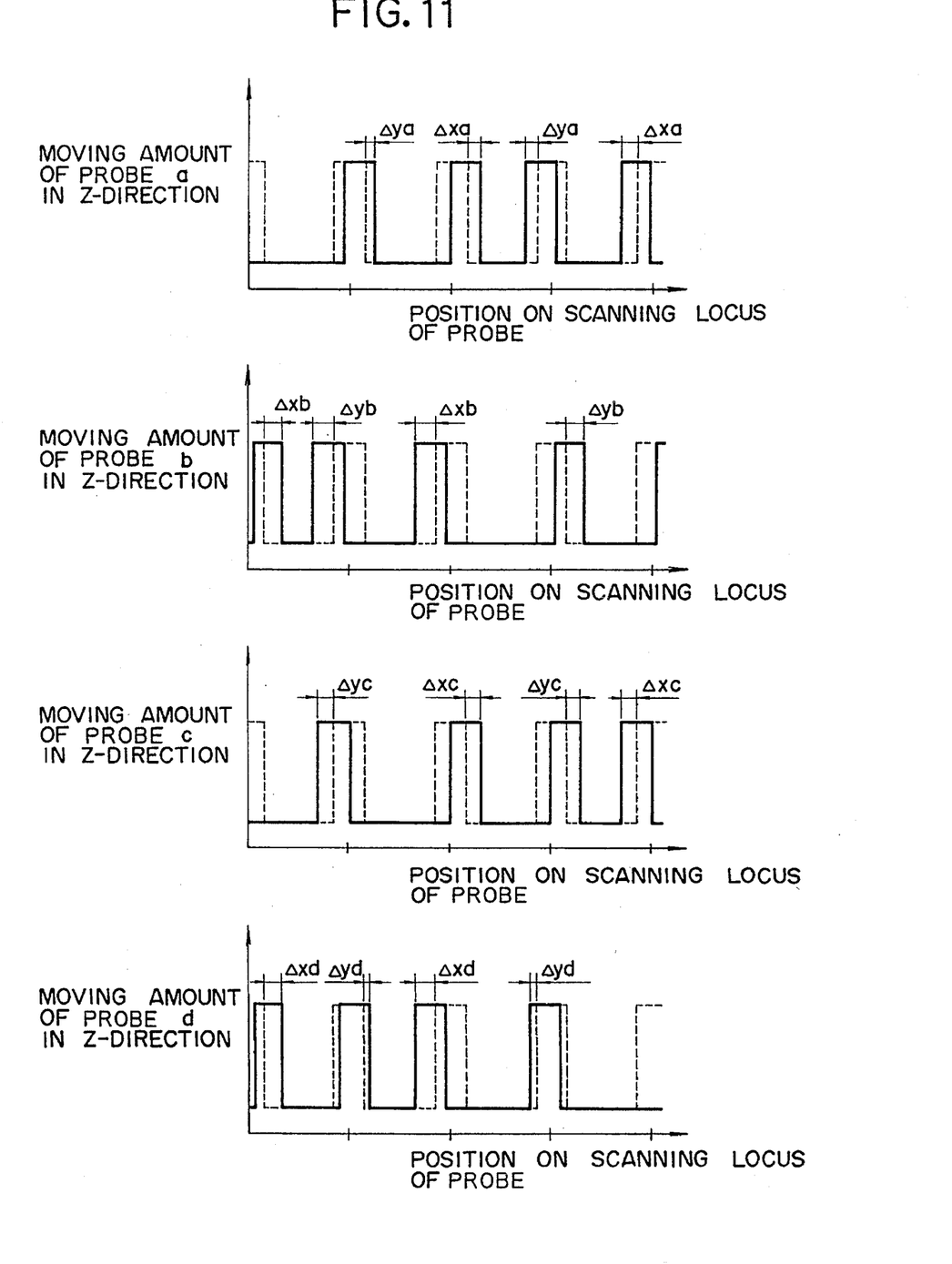
FIG. 11 is a chart showing position detection waveforms in the alignment method shown in FIG. 10.

In the above embodiment, each positioning mark has a cross shape, as shown in FIG. 4. However, the present invention is not limited to this. For example, the positioning mark may have another shape, e.g., a rectangular shape, or an irregular shape. As the method of scanning the probes, a method of detecting the relative positional displacements between the probes and the marks based on image information obtained by two-dimensionally scanning a rectangular region on the mask including the positioning marks has been described. In place of this method, a method of detecting the relative positional displacements from z-moving amount waveforms of the probes upon scanning of portions of the positioning marks on a circumference by a scanning method along the circumference, as shown in FIG. 10, may be adopted. This method will be briefly described below with reference to FIGS. 10 and Before a process, if there are no positional displacements between the four probes a to d and the positioning marks a to d, the probes scan on the positioning marks a to d indicated by dotted lines along a circumference, as shown in FIG. 10, and the z-moving amount waveforms of the probes corresponding to points on the circumference are dotted waveforms in FIG. 11. When the probes re-scan the positioning marks after the process, if the positioning marks a to d are displaced to the positions indicated by solid lines (circular scanning) in FIG. 10, the z-moving amount waveforms of the probes corresponding to points on the circumference are solid waveforms in FIG. 11. The positional displacements $(\Delta X_a, \Delta Y_a)$, $(\Delta X_b, \Delta Y_b)$, $(\Delta X_c, \Delta y_c)$, and $(\Delta X_d, \Delta Y_d)$ can be obtained on the basis of the changes (shift amount and shift position of respective peaks) from the dotted waveforms to the solid waveforms in FIG. 11. Thereafter, the displacements $\Delta x_1$ and $\Delta y_1$ in the x- and y-directions upon re-setting of the wafer before and after the process, the rotational displacement $\Delta\theta$, and the distortions $\Delta x_2$ and $\Delta y_2$ during the process are calculated in the same manner as in the above embodiment, thereby correcting the positional displacements.

With this method, since the positional displacements can be detected by one-dimensional scanning (circumferential scanning) in place of two-dimensional scanning (surface scanning), displacement detection can be achieved at a higher speed.

Figure 12:
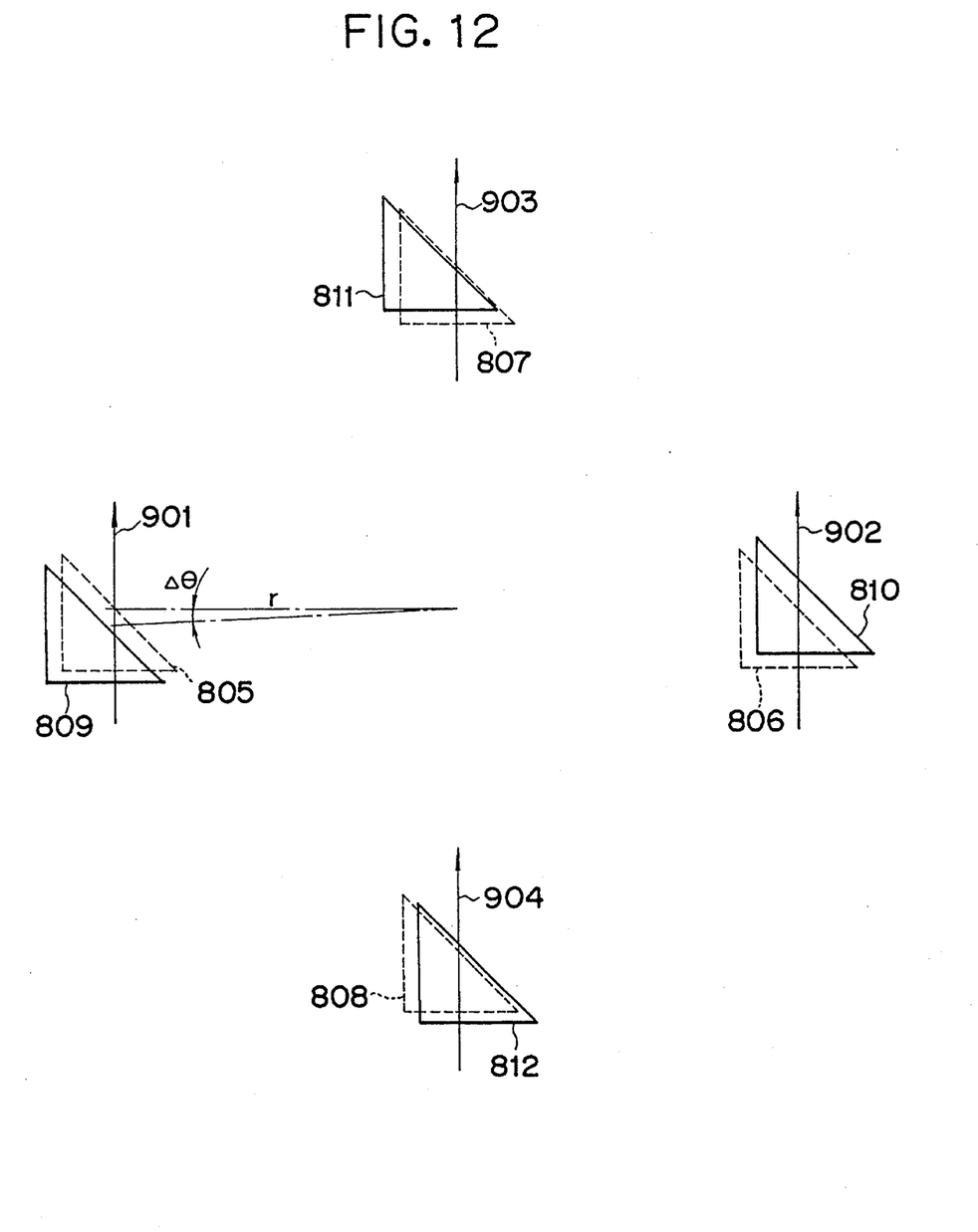
FIG. 12 is an explanatory view for explaining an alignment method based on one-dimensional linear scanning in the horizontal direction of the mask and the wafer.
Figure 13:
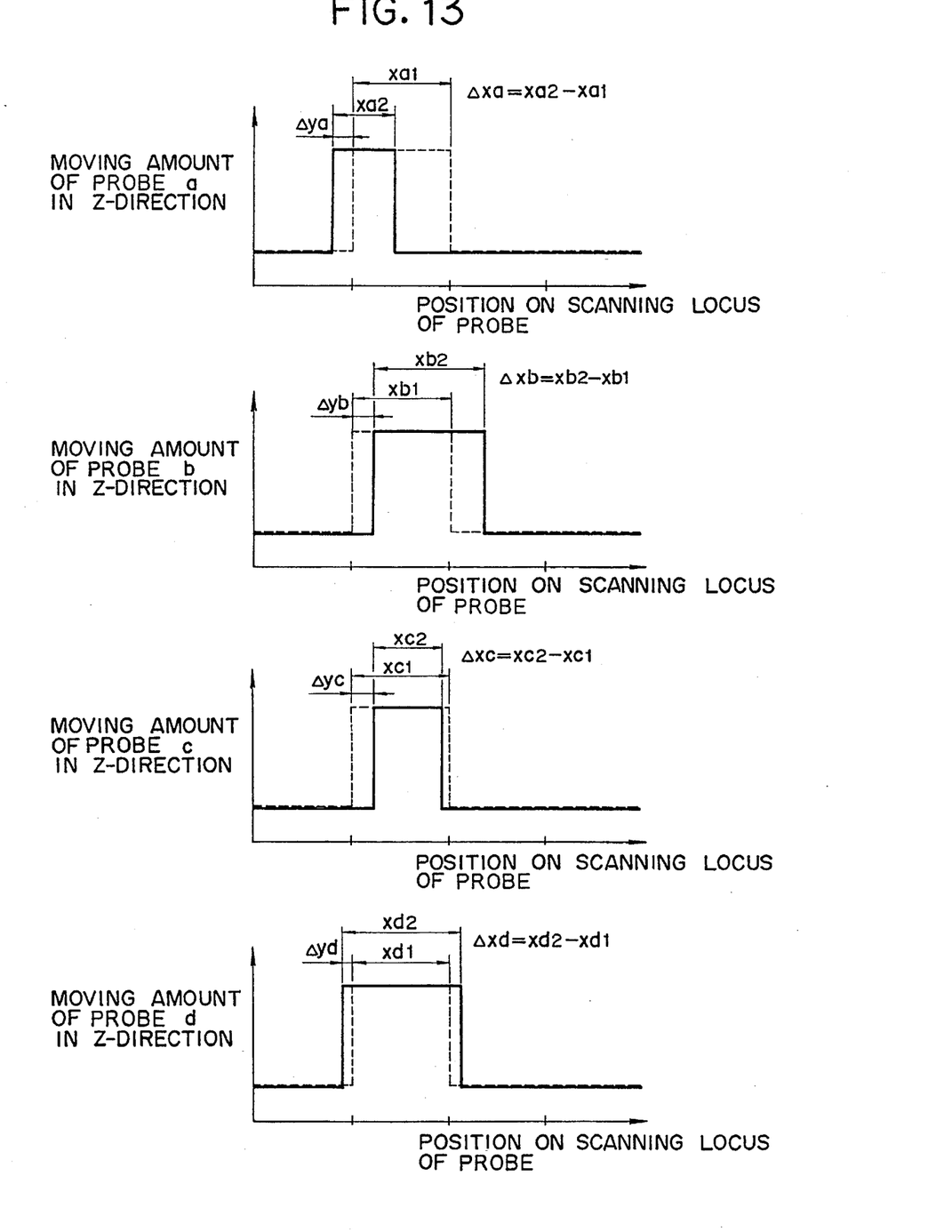
FIG. 13 is a chart showing position detection waveforms in the alignment method shown in FIG. 12.

In order to allow displacement detection at still a higher speed, a method of detecting the relative positional deviations from the z-moving amount waveforms of the probes by scanning portions of the positioning marks by a linear scanning method, as shown in FIG. 12, may be adopted. FIG. 12 shows scanning loci of the probes, and the positions of the positioning marks before and after the process, as in FIG. 10, and FIG. 13 shows the z-moving amount waveforms of the probes corresponding to the points on the scanning loci of the probes, and the positional displacements before and after the process, as in FIG. 11. In this case, the positional displacements can be corrected in the same manner as in the above embodiment.

In this case, the shape of the positioning mark is not limited to a shape shown in FIG. 12, either.

The ultra high precision alignment of, e.g., an X-ray stepper, an aligner, and the like is realized by the above-mentioned mask-wafer alignment method. In actual processes, the wafer must be aligned with respect to a plurality of masks upon repetition of 10 exposure processes. However, in the method of the present invention, the formation precision (especially in the x- and y-directions) of the probes to be provided to the elastic members on the mask is limited, and the positions of the probes are slightly displaced in units of masks. In order to correct this, a plurality of masks to be used in the process are exposed in advance using a reference wafer having positioning marks, and the positional displacements of exposure patterns are measured by, e.g., an electron microscope so as to obtain the positional displacements, in the x- and y-directions, of the probes caused upon formation of the respective mask. Thus, the displacements of the mask-wafer during the actual process can be corrected based on the above-mentioned positional displacements.

Figure 5:
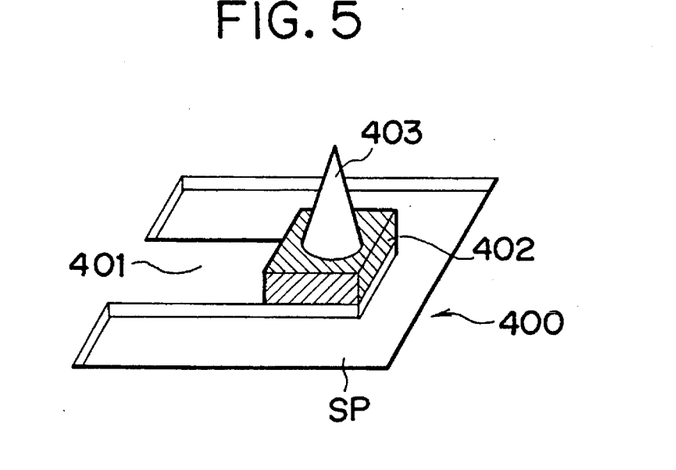
FIG. 5 is a perspective view showing an arrangement of the cantilever shown in FIG. 2.
Figure 6:
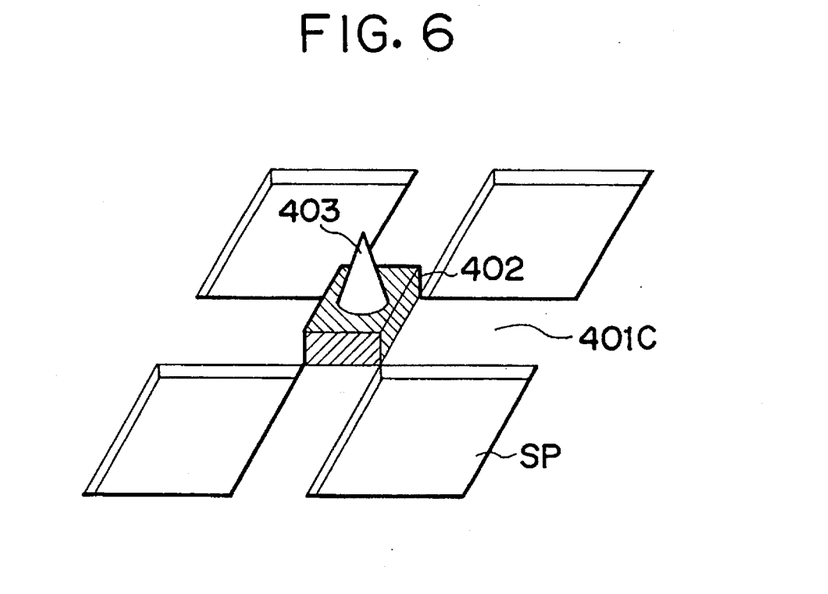
FIG. 6 is a perspective view showing a cross lever as an example of an elastic member adopting the present invention.
Figure 7:
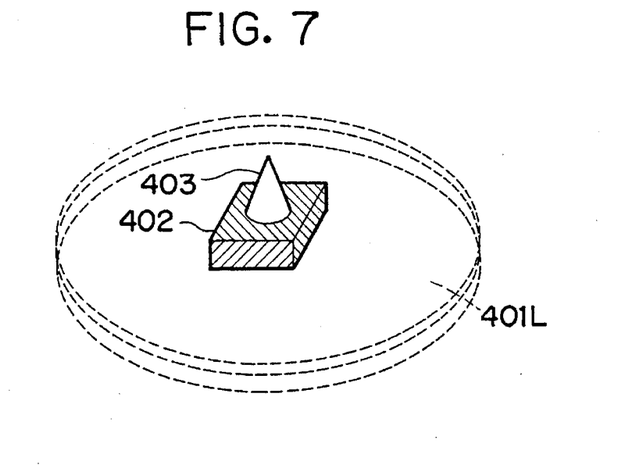
FIG. 7 is a perspective view showing a circular thin film as another example of an elastic member adopting the present invention.
Figure 8:
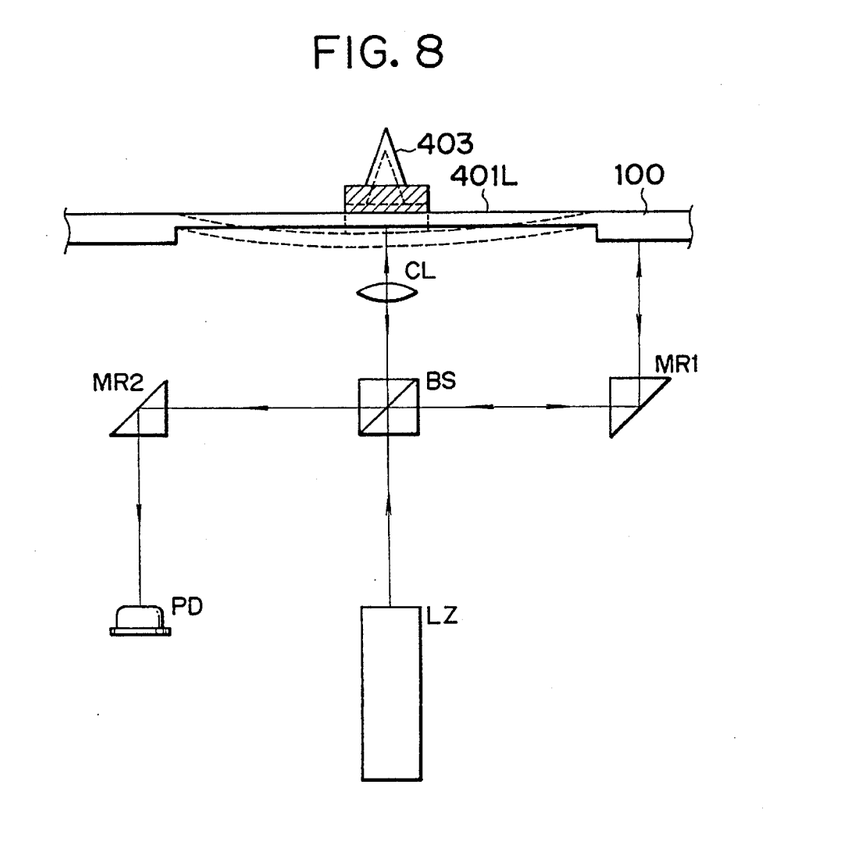
FIG. 8 is a view showing an arrangement of a light wave interferometer for detecting the moving amount of a probe supported by the elastic member shown in FIG. 7.

A method of forming the cantilevers and the probes on the mask of the present invention will be described below. In this embodiment, as shown in FIG. 5, a structure wherein a probe 403 is provided on a probe base 402 on a cantilever 401 formed of a mask base material 400 has been described. In the method of forming this structure, an $Si_3N_4$ thin film is formed on an Si substrate by a sputtering method, and a cantilever shape is formed by a photolithography process. Thereafter, a gold mask pattern (122 in FIG. 2) is formed on a mask base material consisting of an $Si_3N_4$ thin film (with a thickness of 2 μm) using an electron beam lithography method, and at the same time, a gold probe base is formed. Normally, the thickness of the gold mask pattern, i.e., the height of the probe base is about 0.7 μm. Thereafter, Si is removed by etching to form a gap portion SP in the mask base material, thus forming a cantilever. The cantilever formed in practice in this embodiment had a length of 100 μm, and a width of 20 μm. Finally, for example, a probe having an arbitrary length (10 to 30 μm) is formed at the distal end of the cantilever by an electron beam deposition method of, e.g., a carbon. As an elastic member on the mask in the present invention, a cross lever-shaped elastic member 401C (FIG. 6) or a circular thin film-shaped elastic member 401L (FIG. 7) may be used. When these members are used, a method of detecting the force acting between the tip of the probe and the resist film using a light wave interferometer from the rear surface of the elastic member, as shown in FIG. 8, may be used, as a means for detecting the force. In this case, an interferometer having the following function is used. That is, a laser beam emitted from a laser LZ is split by a beam splitter BS, and the beam transmitted through the beam splitter is focused on the rear surface of the base of the thin film-shaped elastic member 401L. Light reflected by the rear surface of the base is guided to the beam splitter BS via a lens CL, and is multiplexed with light reflected by the surface of the mask 100 as a stationary portion via a mirror MR1. The multiplexed light is detected by a photodiode PD via a mirror MR2.

In this embodiment, a method of aligning a mask having elastic members for supporting probes, and a wafer having positioning marks at positions opposing the probes has been described. In contrast to this, a wafer having elastic members for supporting probes and a mask having positioning marks at positions opposing the probes may be aligned.

As described above, the probes supported by the elastic members on the mask or the wafer are provided, the probes are set to oppose marks provided on the wafer or the mask, and forces acting between the probes and the marks are detected, thereby detecting the relative positional displacement between the mask and the wafer. For this reason, even when a resist having no conductivity is coated on the wafer, the following effects can be expected:

① interval control in the normal direction between the mask and the wafer having a precision on the order of 1 nm can be realized, and ② relative alignment in the horizontal direction between the mask and the wafer having a precision on the order of 1 nm can be realized.

What is claimed is:

1. A method in which a position detection mark provided on a wafer is detected by using an elastic member provided on a mask and the relative positional deviation between the mask and the wafer is corrected in accordance with the detection results, comprising the steps of:

performing a first relative movement between the mask and the wafer such that the elastic member scans a predetermined region including the position detection mark on the wafer;

detecting a first deformation amount of the elastic member on the basis of a force acting between he elastic member and the position detection mark;

calculating a first relative position deviation amount between the mask and the wafer from the detected first deformation amount;

correcting the first relative position between the mask and the wafer on the basis of the calculated first relative position deviation amount;

performing a second relative movement between the mask and the wafer such that the elastic member scans a region on the wafer which includes the position detection mark and which is smaller than the predetermined region;

detecting a second deformation amount of the elastic member on the basis of a force acting between the elastic member and the position detection mark;

calculating a second relative position deviation amount between the mask and the wafer from the detected second deformation amount detected in said second deformation detecting step; and correcting the second relative position between the mask and the wafer on the basis of the calculated second relative position deviation amount calculated in said second calculating step.

2. A method according to claim 1, wherein the elastic member comprises a cantilever.

3. A method according to claim 2, wherein a probe is provided on a free end side of the cantilever.

4. A method according to claim 1, wherein said first and second deformation amount detection steps comprise the step of irradiating a part of the elastic member with a laser beam and detecting the deformation amount of the elastic member on the basis of a variation of an incident position of a beam reflected from the elastic member on a light-receiving element.

5. A method according to claim 1, wherein the relative movement comprises a circular motion.

6. A method in which a position detection mark provided on a wafer is detected by using an elastic member provided on a mask and the relative positional deviation between the mask and the wafer is corrected in accordance with the detection result, comprising the steps of:

performing a relative movement between the masks and the wafer such that the elastic member scans the position detection mark with a circular motion;

detecting a deformation amount of the elastic member on the basis of a force acting between the elastic member and the position detection mark;

calculating a relative position deviation amount between the mask and the wafer from the detected deformation amount; and correcting the relative position between the mask and the wafer on the basis of the calculated relative position deviation amount.

7. A method according to claim 6, wherein the elastic member comprises a cantilever.

8. A method according to claim 7, wherein a probe is provided on a free end side of the cantilever.

9. A method according to claim 6, wherein said deformation amount detection step comprises a step of irradiating a part of the elastic member with a laser beam and detecting the deformation amount of the elastic member on the basis of a variation of an incident position of a beam reflected from the elastic member on a light-receiving element.

10. A method in which a plurality of position detection marks provided on a wafer are detected by using a plurality of elastic members provided on a mask and opposed to the plurality of position detection masks and the relative positional deviation between the mask and the wafer is corrected in accordance with the detection results, comprising the steps of:

performing a relative movement between the mask and the wafer such that the respective elastic members scan the respective position detection marks opposed to the respective elastic members;

detecting respective deformation amounts of the respective elastic members on the basis of respective forces acting between the respective elastic members and the respective position detecting marks;

calculating respective relative position deviation amounts of the mask with respect to the respective position detection marks on the basis of the respective detected deformation amounts; and adjusting the relative position between the mask and the wafer so that the deviation of the calculated respective relative position deviation amounts of the mask with respect to the respective position detection marks is minimized.

11. A method of correcting a relative positional deviation between a mask and a wafer in an exposure apparatus in which a position detection mark provided on the wafer is detected using an elastic member including a probe provided on the mask and the relative positional deviation between the mask and the wafer is corrected in accordance with the detection result, and a pattern formed on the mask is exposed onto the wafer for a plurality of masks, respectively, comprising the steps of:

providing a reference wafer provided with a positioning mark in place of the wafer;

scanning the probe on the positioning mark provided on the reference wafer;

detecting a relative positional displacement between the probe and the positioning mark on the basis of the scanning of the probe on the positioning mark;

aligning the mask and the reference wafer on the basis of the detected relative positional displacement;

successively exposing patterns formed on the plurality of masks onto the reference wafer;

measuring a position deviation amount of each of the exposure patterns on the reference wafer; and calculating a position deviation amount of the probe on each of the plurality of masks, caused upon forming each of the plurality of masks on the basis of the measurement result, wherein when the relative positional deviation between the wafer and the respective masks is to be corrected, the correction is made taking into account the calculated positional deviation amount.

* * * * *

UNITED STATES PATENT AND TRADEMARK OFFICE
CERTIFICATE OF CORRECTION

PATENT NO. : 5,508,527
DATED : April 16, 1996
INVENTOR(S) : RYO KURODA, et al.

It is certified that error appears in the above-indentified patent and that said Letters Patent is hereby corrected as shown below:

ON THE COVER PAGE

[57] IN THE ABSTRACT

Line 3, "The" should read --A--.
Line 4, "A" should read --The--.

COLUMN 1

Line 15, "the" should read --a--, and "a" should read --the--.
Line 32, "land" should read --1 and--.
Line 36, "transmits" should read --transmit--.
Line 56, "been" should read --been developed--.

COLUMN 3

Line 13, "laser" should read --lasers--.

COLUMN 4

Line 34, "($\Delta X_c$," should read --($\Delta x_c$,--.

COLUMN 5

Line 33, "and" should read --and 11.--.
Line 45, "($\Delta X_a, \Delta Y_a$), ($\Delta X_b, \Delta Y_b$)," should read --($\Delta x_a, \Delta y_a$), ($\Delta x_b, \Delta y_b$)--.
Line 46, "$\Delta X_c$," should read --($\Delta x_c$,--; and "$\Delta X_d, \Delta Y_d$" should read --$\Delta x_d, \Delta y_d$--.

UNITED STATES PATENT AND TRADEMARK OFFICE
CERTIFICATE OF CORRECTION

PATENT NO. : 5,508,527

DATED : April 16, 1996

INVENTOR(S) : RYO KURODA, et al.

It is certified that error appears in the above-indentified patent and that said Letters Patent is hereby corrected as shown below:

COLUMN 6

Line 12, "10" should read --the--.

COLUMN 7

Line 28, "he" should read --the--.

COLUMN 8

Line 4, "masks" should read --mask--.
Line 31, "results" should read --result--.

Signed and Sealed this

Twenty-ninth Day of October 1996

BRUCE LEHMAN

Attest:

Attesting Officer

Commissioner of Patents and Trademarks